United States Patent
Ploeg et al.

(10) Patent No.: US 9,337,628 B2
(45) Date of Patent: May 10, 2016

(54) IONIC COOLING ASSEMBLY FOR ELECTRONIC DEVICE

(71) Applicant: Intel Corporation, Santa Clara, CA (US)

(72) Inventors: Johan Ploeg, Hillsboro, OR (US); David Pidwerbecki, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 14/038,053

(22) Filed: Sep. 26, 2013

(65) Prior Publication Data

US 2015/0085421 A1    Mar. 26, 2015

(51) Int. Cl.
| | | |
|---|---|---|
| *H01T 23/00* | (2006.01) | |
| *H05F 3/00* | (2006.01) | |
| *G06F 1/20* | (2006.01) | |
| *H05K 7/20* | (2006.01) | |

(52) U.S. Cl.
CPC ............... *H01T 23/00* (2013.01); *G06F 1/203* (2013.01); *H05K 7/20* (2013.01)

(58) Field of Classification Search
CPC .................. H01L 2924/0002; H01L 2924/00
USPC ......................................... 361/231
See application file for complete search history.

(56) References Cited

U.S. PATENT DOCUMENTS

| | | | | |
|---|---|---|---|---|
| 6,522,536 B2 * | 2/2003 | Brewer | ............. | H05K 7/20727 165/80.3 |
| 7,585,352 B2 * | 9/2009 | Dunn | ........................ | B03C 3/09 95/73 |
| 8,139,354 B2 * | 3/2012 | June | ........................ | G06F 1/206 165/109.1 |
| 2006/0215363 A1 * | 9/2006 | Shipley | ............. | H05K 7/20563 361/695 |
| 2012/0002342 A1 * | 1/2012 | Lee | ........................ | F28F 13/16 361/231 |

* cited by examiner

*Primary Examiner* — Dharti Patel
(74) *Attorney, Agent, or Firm* — Alpine Technology Law Group LLC

(57) ABSTRACT

In one embodiment an ionic airflow system comprises an anode, a cathode platform having an elongated surface, and a first ultrasonic transducer to direct ultrasonic waves into the cathode platform. Other embodiments may be described.

25 Claims, 10 Drawing Sheets

IONIC COOLING ASSEMBLY FOR ELECTRONIC DEVICE

RELATED APPLICATIONS

None.

BACKGROUND

The subject matter described herein relates generally to the field of electronic devices and more particularly to an ionic cooling assembly for one or more electronic devices.

Modern computing systems generate heat during operation. The heat may affect certain platform components of a system, and is therefore generally required to be dissipated or removed from the system. Heat generated by the computing system may be limited or reduced using various thermal management techniques and/or heat dissipation techniques. For example, heat generated by a processor may be dissipated by creating a flow of air using a fan or blower. Further, various platform-level cooling devices may be implemented in conjunction with the fan or blower to enhance heat dissipation, such as heat pipes, heat spreaders, heat sinks, vents, phase change materials or liquid-based coolants.

Traditional fans comprise numerous moving parts which are subject to failure and which may introduce vibration into an electronic device. Accordingly, a need exists for additional cooling techniques for notebook computers.

BRIEF DESCRIPTION OF THE DRAWINGS

The detailed description is described with reference to the accompanying figures.

DETAILED DESCRIPTION

Described herein are exemplary embodiments of an ionic cooling assembly for electronic devices and electronic devices which include an ionic cooling assembly. In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Figure 1:
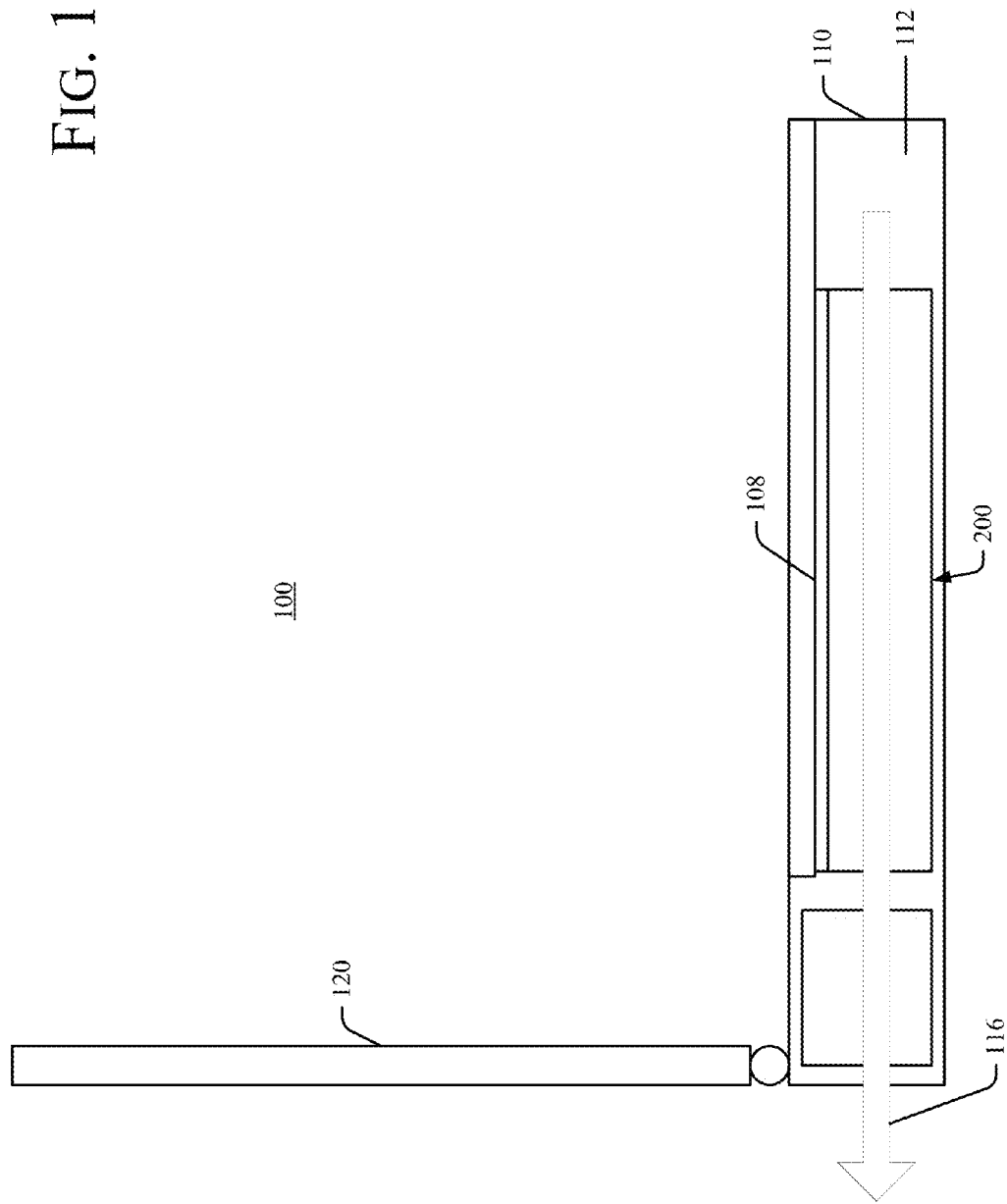
FIG. 1 is a schematic illustration of an electronic device which may be modified to include an ionic cooling assembly in accordance with some embodiments.

FIG. 1 is a schematic illustration of a housing 100 an electronic device which may be modified to include an ionic cooling assembly in accordance with some embodiments. Housing 100 may be for an electronic device such as a laptop computer, notebook computer, tablet computing device, electronic reader, or the like. As shown in FIG. 1, housing 100 comprises a display 120, and a first section 110, sometimes referred to as a base, which defines an internal chamber 112. An ionic cooling assembly 200 may be positioned in the internal chamber 112 to create an airflow 116 within the internal chamber 112. The embodiments of housing 100, however, are not limited to the elements shown in FIG. 1.

Figure 2:
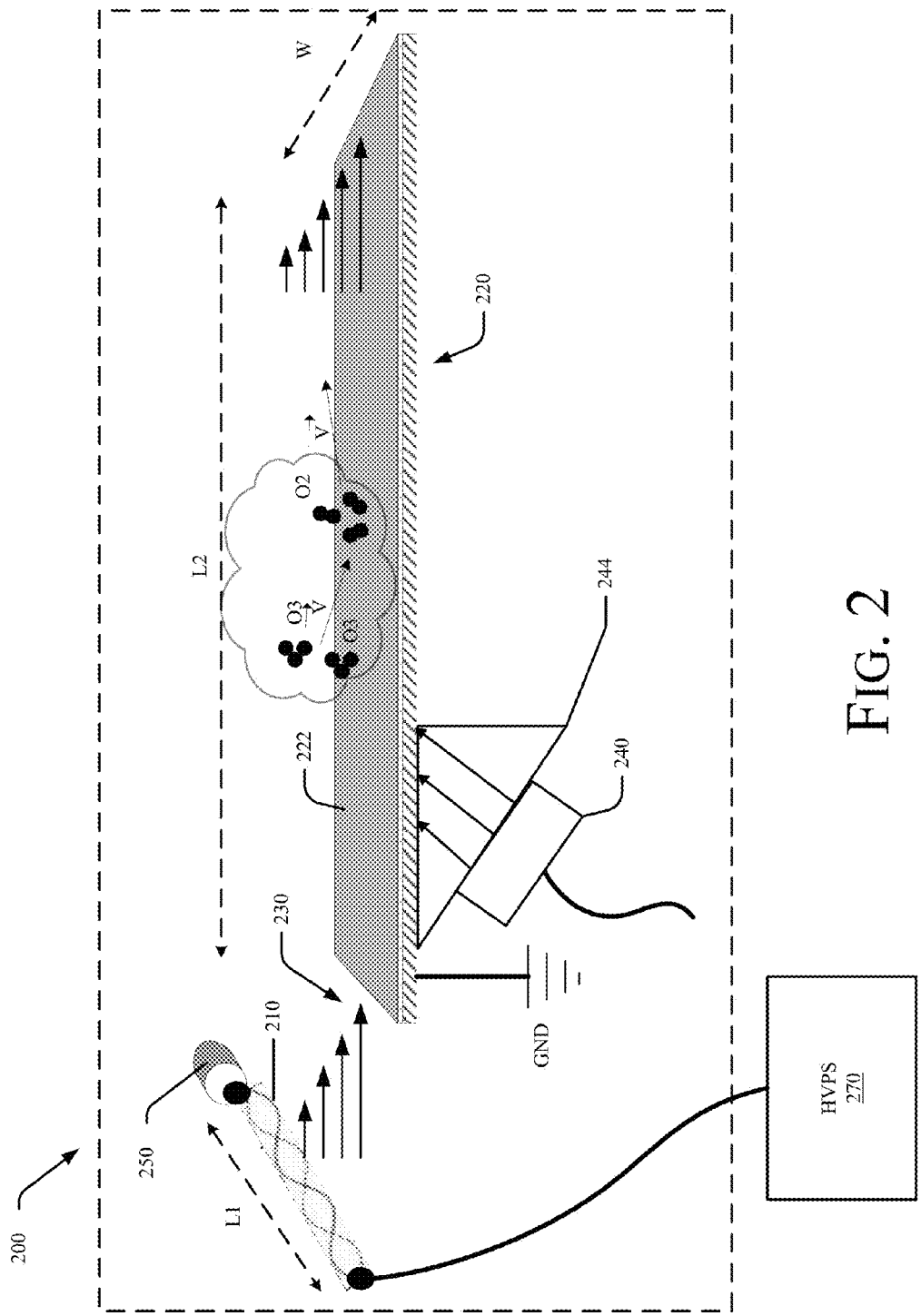
FIG. 2 is a schematic, perspective view illustration of an ionic cooling assembly in accordance with some embodiments.

Aspects of an ionic cooling assembly 200 will be explained with reference to FIG. 2. Referring to FIG. 2 in some embodiments an ionic airflow system 200 comprising an anode 210, a cathode platform 220 having an elongated surface 212 and a first ultrasonic transducer 240 to direct ultrasonic waves into the cathode platform 220.

Anode 210 may comprise a conductive wire having a length, L1, which measures between 1 millimeters and 300 millimeters. An ultrasonic transducer 250 may be coupled to the anode to inject ultrasonic waves into the anode 210.

Cathode platform 220 may be formed from an electrically conductive material and may include a substantially planar surface 222. In some embodiments the ultrasonic transducer 240 is positioned to deliver ultrasonic waves, e.g., L-waves and S-waves, into the cathode platform 220 at an incidence angle that measures between 10 degrees and 80 degrees relative to the plane of the planar surface 222. By way of example, in some embodiments a mounting block 244 is used to mount the ultrasonic transducer 240 to the cathode platform 220. The mounting block 244 may be a prism such that the ultrasonic transducer 240 is positioned at an angle that measures between 10 degrees and 80 degrees relative to the plane of the planar surface 222.

In some embodiments the cathode platform 220 is coated with a catalyst to convert ozone ($O_3$) to oxygen ($O_2$). Examples of catalysts may include manganese oxide, manganese dioxide and copper oxide. Further, in some examples the cathode platform 220 is structured to decrease resistance to airflow over the cathode platform 220. By way of example, the surface 222 of the cathode platform 220 may be patterned with dimples or protuberances to reduce resistance to airflow over the surface 222. In other examples the surface 222 of cathode platform 220 may be covered with a material that includes microstructures to reduce resistance to airflow over surface 222. Further, a structured surface encourages dust to settle into low points (i.e., valleys or grooves) which leaves higher points of the surface exposed to ion exchange.

Further, in some embodiments at least one of the anode 210 or the cathode platform 220 are provided with a coating to reduce particulate adhesion. Examples of suitable coatings include anti-stick electret polymers, e.g., polytetrafluoroethylene (PTFE), perfluoroalkoxy (PFA), and fluorinated ethylene propylene (FEP).

The physical dimensions of the various components of system 200 are not critical and may be determined by the cooling application. In some embodiments the cathode platform 220 has a length, L2, which measures between 2 millimeters and 50 millimeters and a width, W, which measures between 2 millimeters and 300 millimeters.

In some embodiments the length L1 of the anode 210 may be approximately the same as the width W of the cathode platform 220. By way of example, in some embodiments the difference between the length of the anode 210 and the width W of the cathode platform 220 is not more than 50 percent of the length L1.

A high voltage power supply 270 is coupled to the anode 210. Cathode platform may be coupled to ground or may be coupled to the power supply 270. In operation, power supply 270 generates a voltage differential between anode 210 and cathode platform 220 to create a high electric field gradient (operation 310) between the anode 210 and the cathode platform 220, which ionizes oxygen and nitrogen molecules in the air. The electric field drives the ionized particles from the anode 210 toward the cathode platform 220, which creates an airflow 230 across cathode platform 220.

Ultrasonic transducer 240 injects L-waves and S-waves into the cathode platform 220 (operation 315). At least some of the ultrasonic waves propagate through the cathode platform 220 in the direction of airflow 230 and facilitate the removal of dust and other particulate matter from surface 222 of cathode platform 220. Similarly, ultrasonic transducer 250 injects ultrasonic waves into anode 210 (operation 320) to facilitate removal of dust and particulate matter from anode 210. In addition, transducer 250 applies standing wave pulsation to anode 210 to create a tickling field between anode 210 and cathode platform 220 for improved ion emission and airflow.

Figure 4:
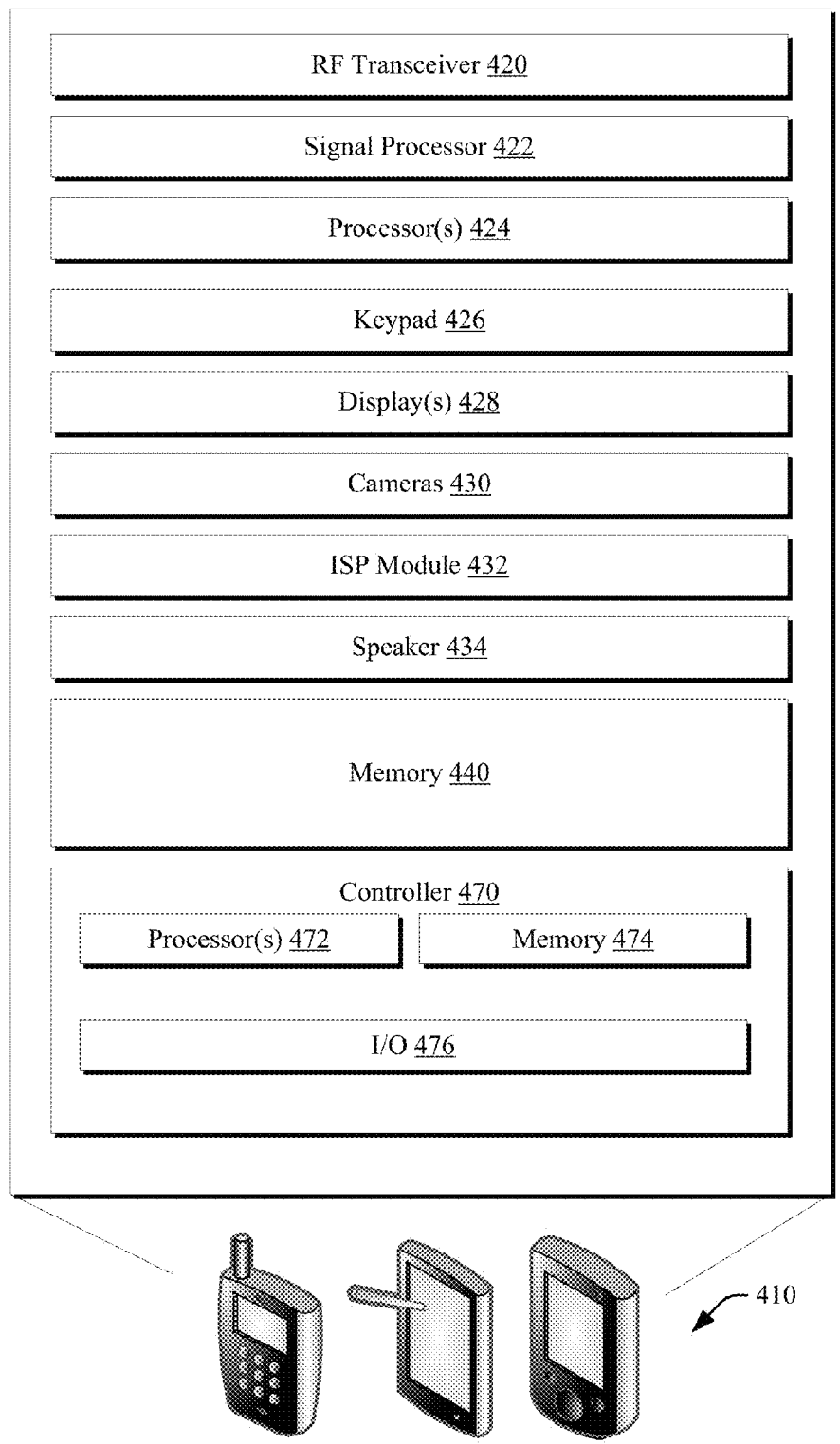
FIGS. 4-5 are schematic illustrations of electronic devices which may be adapted to include an ionic cooling assembly, according to an embodiment.

As described above, in some embodiments an ionic cooling assembly such as that depicted in FIG. 2 may be used in an electronic device. FIG. 4 is a schematic illustration of another embodiment of an electronic device 410 which may be adapted to include an ionic cooling system, according to embodiments. In some embodiments electronic device 410 may be embodied as a mobile telephone, a personal digital assistant (PDA), a laptop computer, or the like. Electronic device 410 may include an RF transceiver 420 to transceive RF signals and a signal processing module 422 to process signals received by RF transceiver 420.

RF transceiver 420 may implement a local wireless connection via a protocol such as, e.g., Bluetooth or 802.11X. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Electronic device 410 may further include one or more processors 424 and a memory module 440. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit. In some embodiments, processor 424 may be one or more processors in the family of Intel® PXA27x processors available from Intel® Corporation of Santa Clara, Calif. Alternatively, other CPUs may be used, such as Intel's Itanium®, XEON™, ATOM™, and Celeron® processors. Also, one or more processors from other manufactures may be utilized. Moreover, the processors may have a single or multi core design.

In some embodiments, memory module 440 includes random access memory (RAM); however, memory module 440 may be implemented using other memory types such as dynamic RAM (DRAM), synchronous DRAM (SDRAM), and the like. Memory 440 may comprise one or more applications which execute on the processor(s) 422.

Electronic device 410 may further include one or more input/output interfaces such as, e.g., a keypad 426 and one or more displays 428. In some embodiments electronic device 410 comprises one or more camera modules 430 and an image signal processor 432, and speakers 434.

In some embodiments electronic device 410 may include a controller 470 which may be implemented in a manner analogous to that of controller 170, described above. In the embodiment depicted in FIG. 4 the controller 470 comprises one or more processor(s) 472, a memory module 474, and an I/O module 476. In some embodiments the memory module 474 may comprise a persistent flash memory module and the authentication module 476 may be implemented as logic instructions encoded in the persistent memory module, e.g., firmware or software. The I/O module 476 may comprise a serial I/O module or a parallel I/O module. Again, because the controller 470 is physically separate from the main processor(s) 424, the controller 470 may be made secure, i.e., inaccessible to hackers such that it cannot be tampered with.

Figure 5:
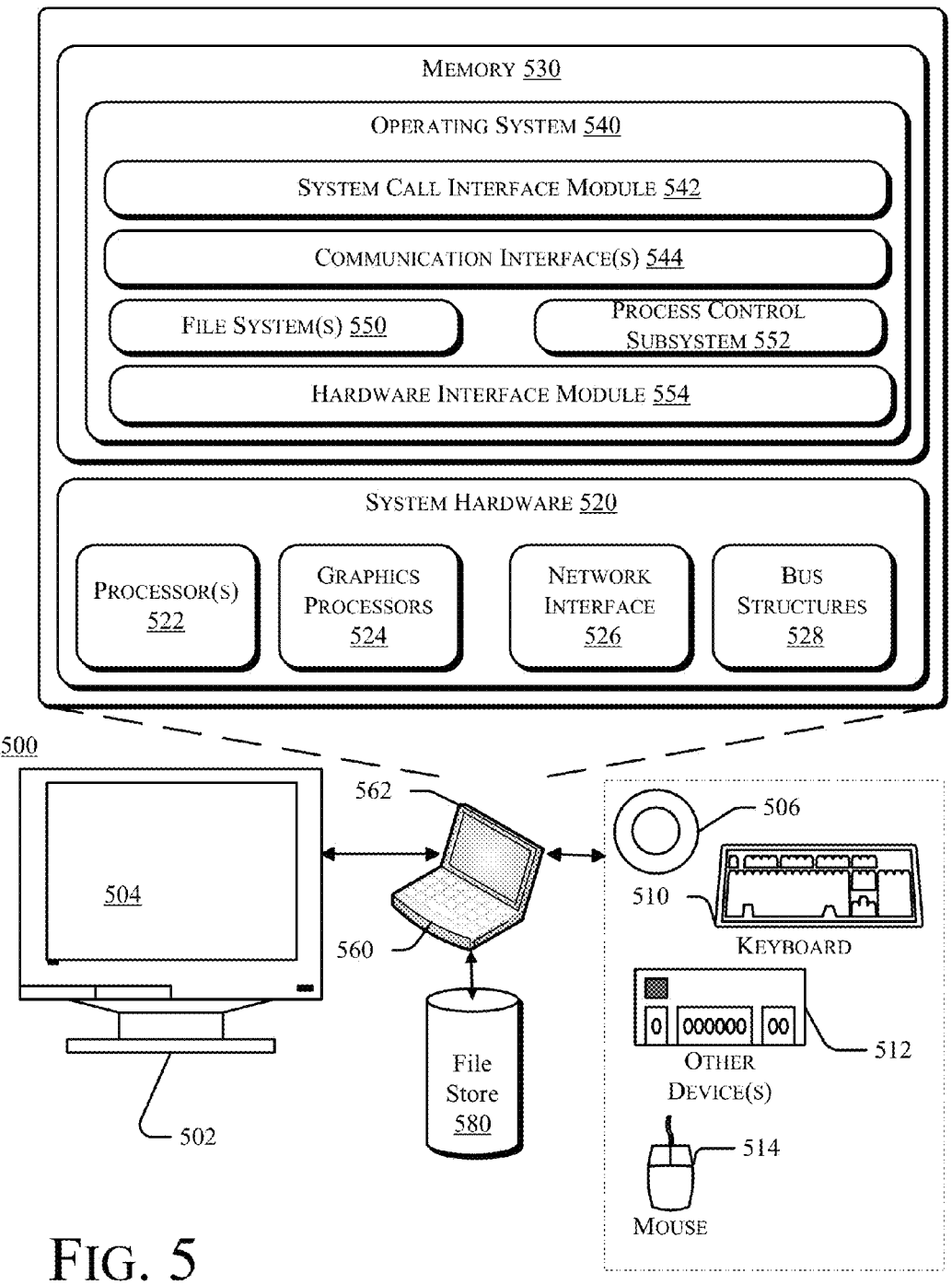

FIG. 5 is a schematic illustration of another exemplary electronic device 500 in accordance with some embodiments. In one embodiment, electronic device 500 may include one or more accompanying input/output devices such as one or more speakers 506, a keyboard 510, one or more other I/O device(s) 512, and a mouse 514. The other I/O device(s) 512 may include a touch screen, a voice-activated input device, a track ball, and any other device that allows the electronic device 500 to receive input from a user.

In various embodiments, the electronic device 500 may be embodied as a personal computer, a laptop computer, a personal digital assistant, a mobile telephone, an entertainment device, or another computing device. The electronic device 500 includes system hardware 520 and memory 530, which may be implemented as random access memory and/or read-only memory. A file store 580 may be communicatively coupled to electronic device 500. File store 580 may be internal to electronic device 500 such as, e.g., one or more hard drives, CD-ROM drives, DVD-ROM drives, or other types of storage devices. File store 580 may also be external to electronic device 500 such as, e.g., one or more external hard drives, network attached storage, or a separate storage network.

System hardware 520 may include one or more processors 522, graphics processors 524, network interfaces 526, and bus structures 528. In one embodiment, processor 522 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 524 may function as adjunct processor that manages graphics and/or video operations. Graphics processor(s) 524 may be integrated onto the motherboard of computing system 500 or may be coupled via an expansion slot on the motherboard.

In one embodiment, network interface 526 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 528 connect various components of system hardware 520. In one embodiment, bus structures 528 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Memory 530 may include an operating system 540 for managing operations of electronic device 500. In one embodiment, operating system 540 includes a hardware interface module 554 that provides an interface to system hardware 520. In addition, operating system 540 may include a file system 550 that manages files used in the operation of electronic device 500 and a process control subsystem 552 that manages processes executing on electronic device 500.

Operating system 540 may include (or manage) one or more communication interfaces that may operate in conjunction with system hardware 520 to transceive data packets and/or data streams from a remote source. Operating system 540 may further include a system call interface module 542 that provides an interface between the operating system 540 and one or more application modules resident in memory 530. Operating system 540 may be embodied as a UNIX operating system or any derivative thereof (e.g., Linux, Solaris, etc.) or as a Windows® brand operating system, or other operating systems.

In one embodiment, electronic device 500, comprises a clamshell body which includes a first section 560, commonly referred to as a base, which houses a keyboard, a motherboard, and other components, and a second section 562 which houses a display. The first section 560 and the second section 562 are connected by a hinge assembly which enables the clamshell body to open and close.

Figure 3:
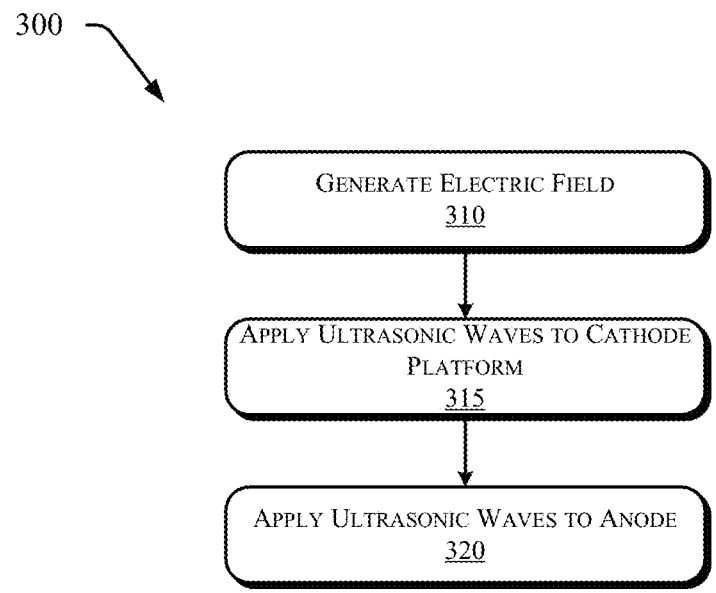
FIG. 3 is a flowchart illustrating operations of an ionic cooling assembly in accordance with some embodiments.
Figure 6:
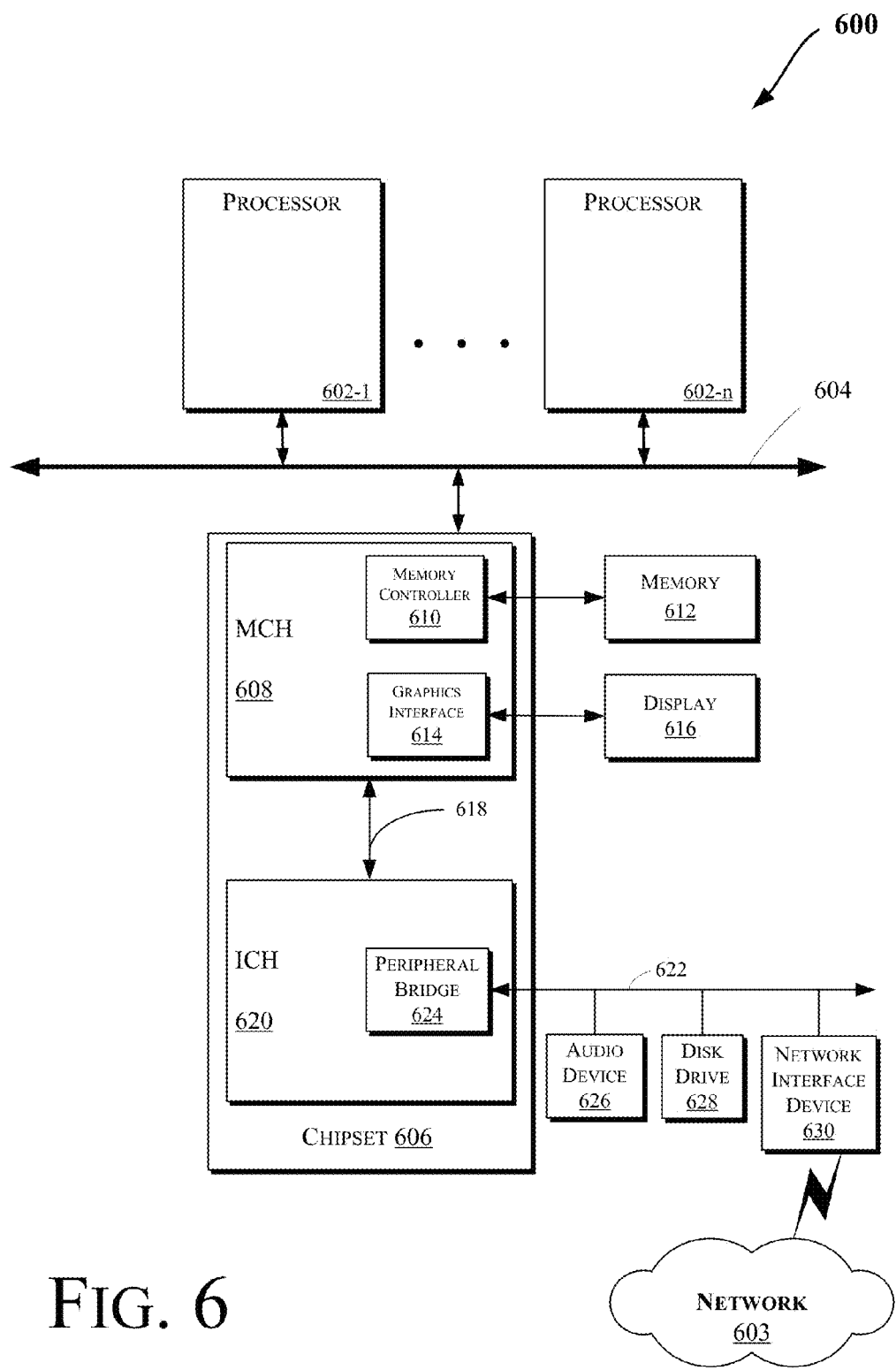
FIGS. 6-10 is a schematic illustration of computing architectures for electronic devices which may be adapted to include an ionic cooling assembly, according to an embodiment.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
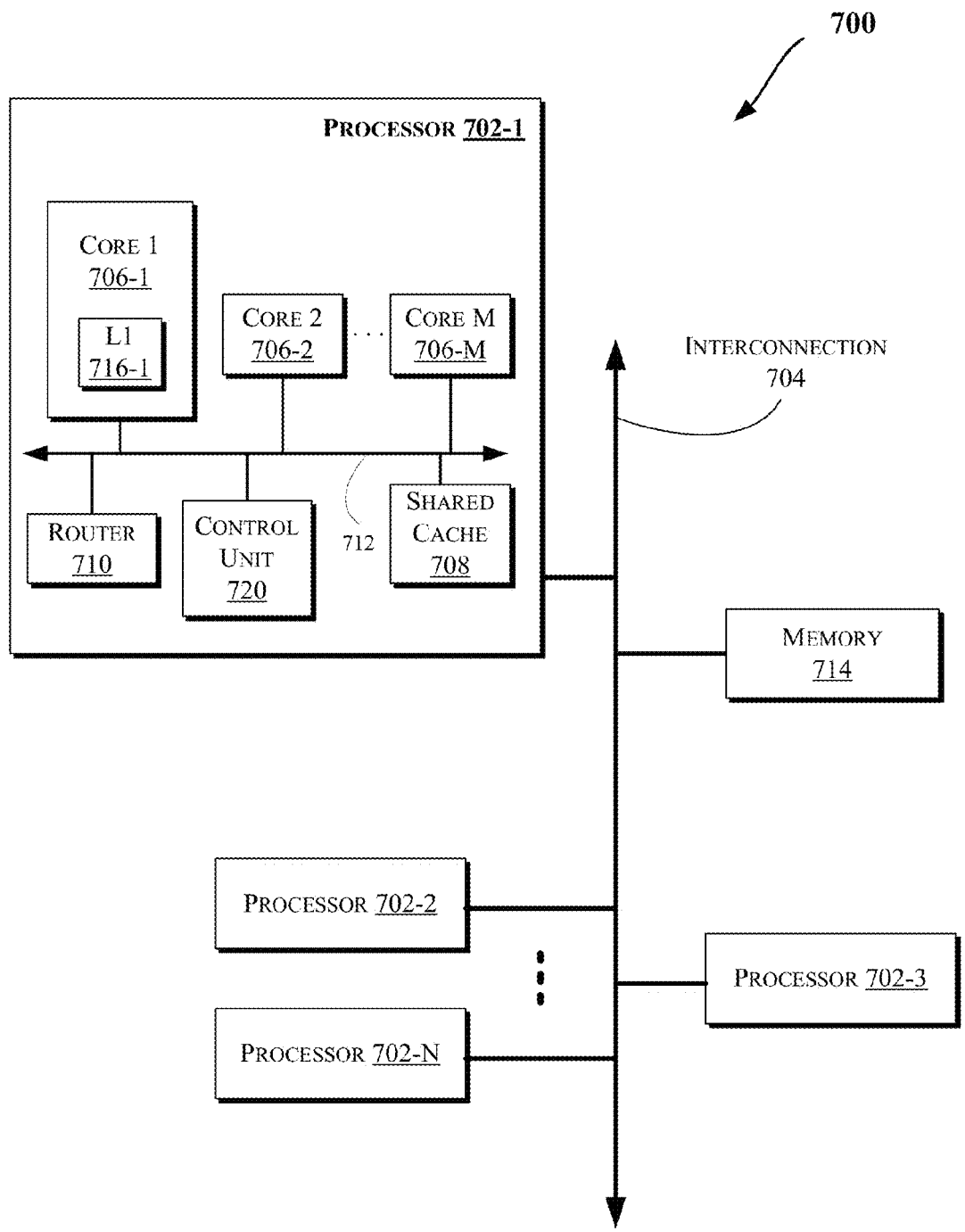

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the control unit 720 may include logic to implement the operations described above with reference to the memory controller 122 in FIG. 2.

Figure 8:
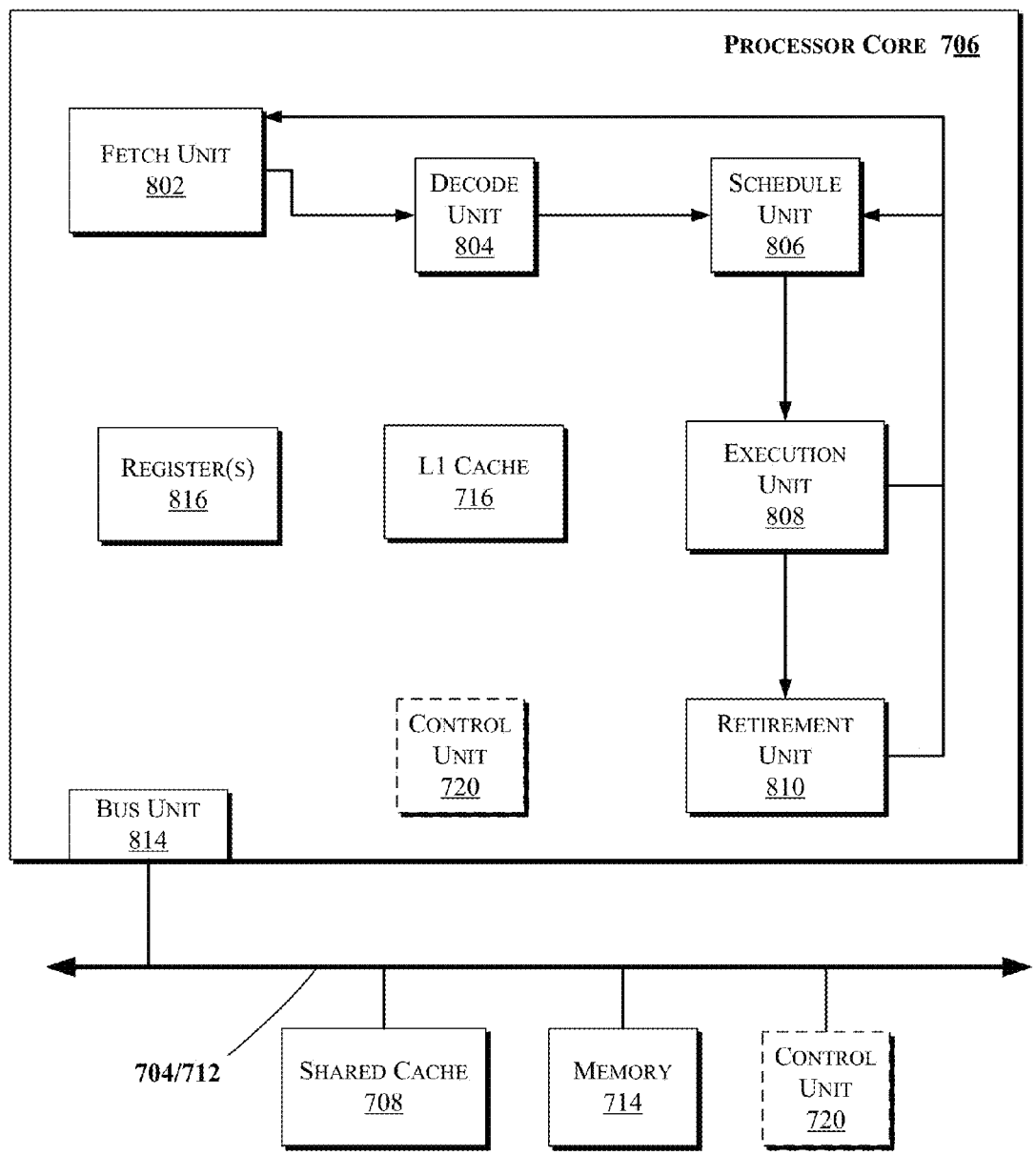

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
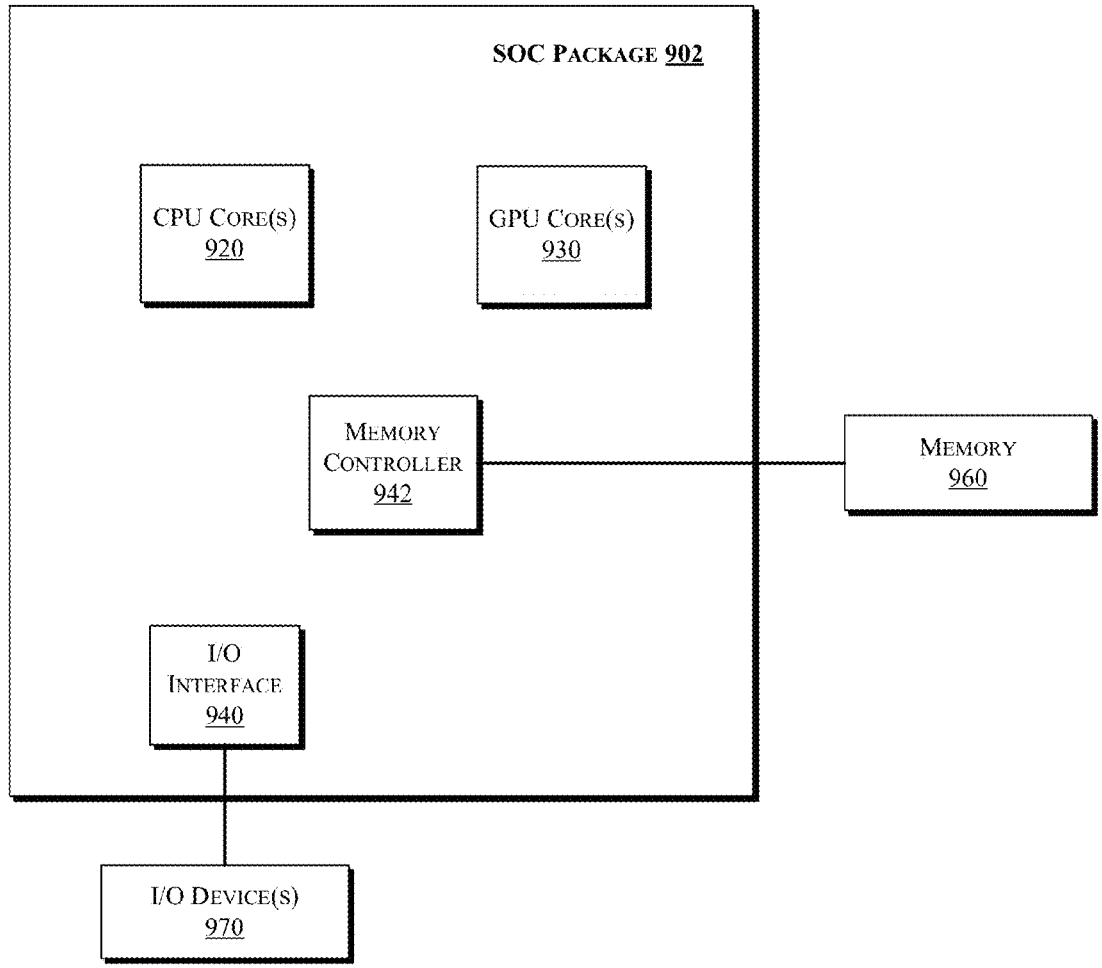

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
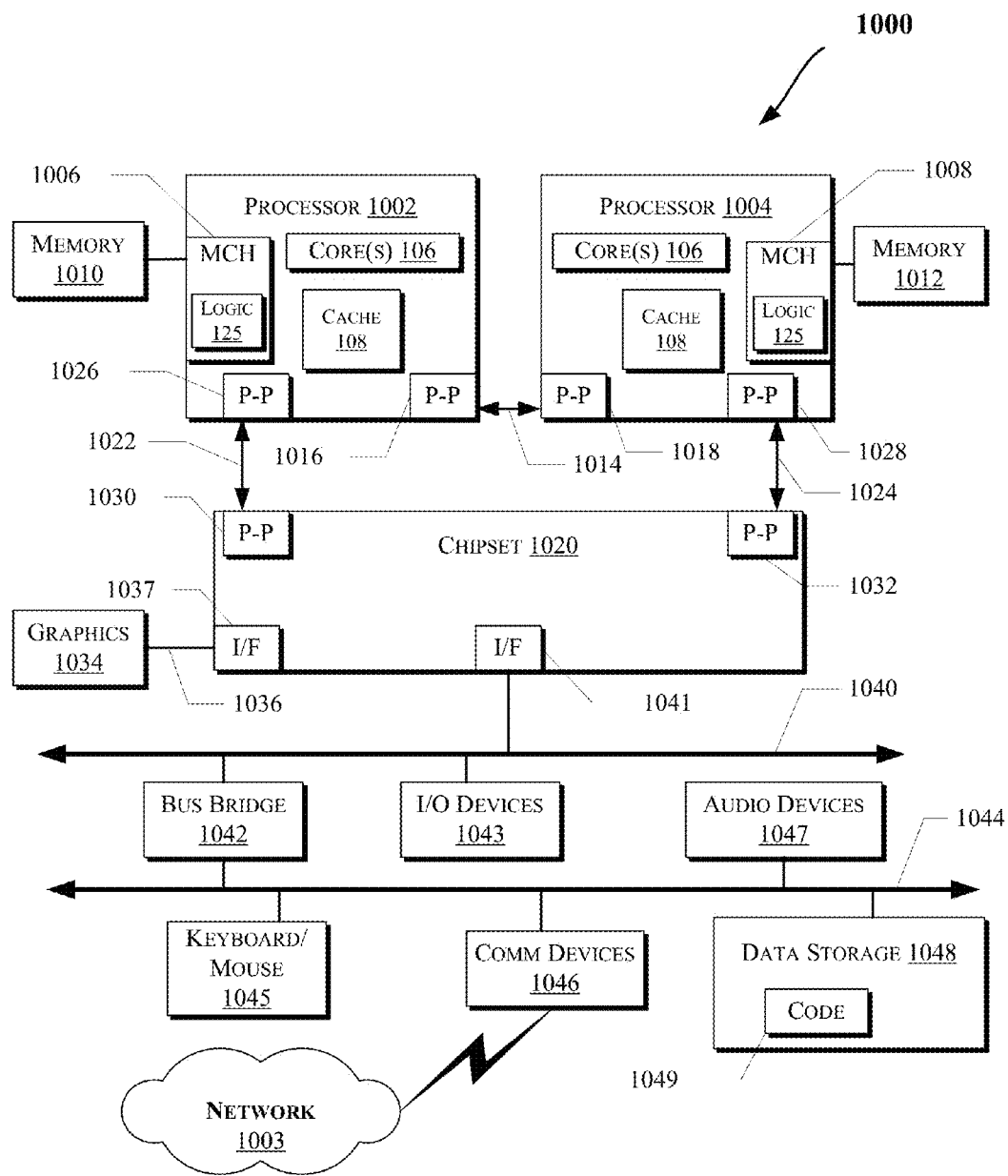

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1004. Other embodiments of the invention, however, may exist in other circuits, logic units, or devices within the system 1000 of FIG. 10. Furthermore, other embodiments of the invention may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following examples pertain to further embodiments.

Example 1 is an ionic airflow system comprising an anode, a cathode platform having an elongated surface and a first ultrasonic transducer to direct ultrasonic waves into the cathode platform.

In Example 2, the subject matter of Example 1 can optionally include a second ultrasonic transducer to inject ultrasonic waves into the anode In Example 3, the subject matter of any one of Examples 1-2 can optionally include a power supply coupled to the anode.

In Example 4, the subject matter of any one of Examples 1-3 can optionally include a first ultrasonic transducer positioned to deliver ultrasonic waves into the cathode platform at an incidence angle that measures between about 10 degrees and about 80 degrees.

In Example 5, the subject matter of any one of Examples 1-4 can optionally include a mounting block to mount the first ultrasonic transducer to the cathode platform, wherein the mounting block is in the shape of a prism.

In Example 6, the subject matter of any one of Examples 1-5 can optionally include an arrangement in which at least one of the anode or the cathode platform are provided with a coating to reduce particulate adhesion.

In Example 7, the subject matter of any one of Examples 1-6 can optionally include an arrangement in which the cathode platform is coated with a catalyst to convert ozone ($O_3$) to oxygen ($O_2$).

In Example 8, the subject matter of any one of Examples 1-7 can optionally include an arrangement in which the cathode platform is structured to decrease resistance to airflow over the cathode platform.

In Example 9, the subject matter of any one of Examples 1-8 can optionally include an arrangement in which the anode comprises a conductive wire having a length, L1, which measures between 1 millimeters and 300 millimeters, the cathode platform has a length, L2, which measures between about 2 millimeters and about 50 millimeters and a width, W, which measures between about 2 millimeters and about 300 millimeters.

In Example 10, the subject matter of any one of Examples 1-4 can optionally include an arrangement in which the anode comprises a conductive wire having a length, L1, extending along a first axis, and the cathode platform has a width, W, wherein a difference between L1 and W is not more than about 150 percent of L1.

Example 11 is a housing for an electronic device, comprising a first section to define an internal chamber, and an ionic airflow system to create an airflow within the internal chamber, comprising an anode, a cathode platform having an elongated surface, and a first ultrasonic transducer to direct ultrasonic waves into the cathode platform.

In Example 12, the subject matter of Example 11 can optionally include a second ultrasonic transducer to inject ultrasonic waves into the anode In Example 13, the subject matter of any one of Examples 11-12 can optionally include a power supply coupled to the anode.

In Example 14, the subject matter of any one of Examples 11-13 can optionally include a first ultrasonic transducer positioned to deliver ultrasonic waves into the cathode platform at an incidence angle that measures between about 10 degrees and about 80 degrees.

In Example 15, the subject matter of any one of Examples 11-14 can optionally include a mounting block to mount the first ultrasonic transducer to the cathode platform, wherein the mounting block is in the shape of a prism.

In Example 16, the subject matter of any one of Examples 11-15 can optionally include an arrangement in which at least one of the anode or the cathode platform are provided with a coating to reduce particulate adhesion.

In Example 17, the subject matter of any one of Examples 11-16 can optionally include an arrangement in which the cathode platform is coated with a catalyst to convert ozone ($O_3$) to oxygen ($O_2$).

In Example 18, the subject matter of any one of Examples 11-17 can optionally include an arrangement in which the cathode platform is structured to decrease resistance to airflow over the cathode platform.

In Example 19, the subject matter of any one of Examples 11-18 can optionally include an arrangement in which the anode comprises a conductive wire having a length, L1, which measures between 1 millimeters and 300 millimeters, the cathode platform has a length, L2, which measures between about 2 millimeters and about 50 millimeters and a width, W, which measures between about 2 millimeters and about 300 millimeters.

In Example 20, the subject matter of any one of Examples 11-14 can optionally include an arrangement in which the anode comprises a conductive wire having a length, L1, extending along a first axis, and the cathode platform has a width, W, wherein a difference between L1 and W is not more than about 150 percent of L1.

Example 21 is an electronic device, comprising at least one electronic component and a housing, comprising a first section to define an internal chamber and an ionic airflow system, comprising an anode, a cathode platform having an elongated surface, and a first ultrasonic transducer to direct ultrasonic waves into the cathode platform.

In Example 22, the subject matter of Example 21 can optionally include a second ultrasonic transducer to inject ultrasonic waves into the anode In Example 23, the subject matter of any one of Examples 21-22 can optionally include a power supply coupled to the anode.

In Example 24, the subject matter of any one of Examples 21-23 can optionally include a first ultrasonic transducer positioned to deliver ultrasonic waves into the cathode platform at an incidence angle that measures between about 10 degrees and about 80 degrees.

In Example 25, the subject matter of any one of Examples 21-24 can optionally include a mounting block to mount the first ultrasonic transducer to the cathode platform, wherein the mounting block is in the shape of a prism.

In Example 26, the subject matter of any one of Examples 21-25 can optionally include an arrangement in which at least one of the anode or the cathode platform are provided with a coating to reduce particulate adhesion.

In Example 27, the subject matter of any one of Examples 21-26 can optionally include an arrangement in which the cathode platform is coated with a catalyst to convert ozone ($O_3$) to oxygen ($O_2$).

In Example 28, the subject matter of any one of Examples 21-27 can optionally include an arrangement in which the cathode platform is structured to decrease resistance to airflow over the cathode platform.

In Example 19, the subject matter of any one of Examples 21-28 can optionally include an arrangement in which the anode comprises a conductive wire having a length, L1, which measures between 1 millimeters and 300 millimeters, the cathode platform has a length, L2, which measures between about 2 millimeters and about 50 millimeters and a width, W, which measures between about 2 millimeters and about 300 millimeters.

In Example 30, the subject matter of any one of Examples 21-28 can optionally include an arrangement in which the anode comprises a conductive wire having a length, L1, extending along a first axis, and the cathode platform has a width, W, wherein a difference between L1 and W is not more than about 150 percent of L1.

Example 31 is a method to generate an airflow in a housing for an electronic device, comprising generating an electric field between an anode and a cathode platform, applying an ultrasonic wave to the cathode platform.

In example 32, the subject matter of Example 31 can optionally include an arrangement in which the wave is applied at an incidence angle that measures between about 10 degrees and about 80 degrees.

In Example 33, the subject matter of any one of Examples 31-32 can optionally include applying an ultrasonic wave to the anode.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An ionic airflow system, comprising:
   an anode;
   a cathode platform having an elongated surface; and a first ultrasonic transducer to direct ultrasonic waves into the cathode platform.

2. The ionic airflow system of claim 1, further comprising a second ultrasonic transducer to inject ultrasonic waves into the anode.

3. The ionic airflow system of claim 1, further comprising a power supply coupled to the anode.

4. The ionic airflow system of claim 1, wherein the first ultrasonic transducer is positioned to deliver ultrasonic waves into the cathode platform at an incidence angle that measures between about 10 degrees and about 80 degrees.

5. The ionic airflow system of claim 4, further comprising a mounting block to mount the first ultrasonic transducer to the cathode platform, wherein the mounting block is in the shape of a prism.

6. The ionic airflow system of claim 1, wherein at least one of the anode or the cathode platform are provided with a coating to reduce particulate adhesion.

7. The ionic airflow system of claim 1, wherein the cathode platform is coated with a catalyst to convert ozone ($O_3$) to oxygen ($O_2$).

8. The ionic airflow system of claim 1, wherein the cathode platform is structured to decrease resistance to airflow over the cathode platform.

9. The ionic airflow system of claim 1, wherein:
the anode comprises a conductive wire having a length, L1, which measures between 1 millimeters and 300 millimeters:
the cathode platform has a length, L2, which measures between about 2 millimeters and about 50 millimeters and a width, W, which measures between about 2 millimeters and about 300 millimeters.

10. The ionic airflow system of claim 1, wherein:
the anode comprises a conductive wire having a length, L1, extending along a first axis; and
the cathode platform has a width, W;
wherein a difference between L1 and W is not more than about 150 percent of L1.

11. A housing for an electronic device, comprising:
a first section to define an internal chamber; and
an ionic airflow system to create an airflow within the internal chamber, comprising:
an anode;
a cathode platform having an elongated surface; and
a first ultrasonic transducer to direct ultrasonic waves into the cathode platform.

12. The housing of claim 11, further comprising a second ultrasonic transducer to inject ultrasonic waves into the anode.

13. The housing of claim 11, further comprising a power supply coupled to the anode.

14. The housing of claim 11, wherein the first ultrasonic transducer is positioned to deliver ultrasonic waves into the cathode platform at an incidence angle that measures between about 10 degrees and about 80 degrees.

15. The housing of claim 14, further comprising a mounting block to mount the first ultrasonic transducer to the cathode platform, wherein the mounting block is in the shape of a triangular prism.

16. The housing of claim 11, wherein at least one of the anode or the cathode platform are provided with a coating to reduce particulate adhesion.

17. The housing of claim 11, wherein the cathode platform is coated with a catalyst to convert ozone ($O_3$) to oxygen ($O_2$).

18. The housing of claim 11, wherein the cathode platform is structured to decrease resistance to airflow over the cathode platform.

19. The housing of claim 11, wherein:
the anode comprises a conductive wire having a length, L1, which measures between about 1 millimeters and about 300 millimeters:
the cathode platform has a length, L2, which measures between about 2 millimeters and about 50 millimeters and a width, W, which measures between about 2 millimeters and about 300 millimeters.

20. The housing of claim 11, wherein:
the anode comprises a conductive wire having a length, L1, extending along a first axis; and
the cathode platform has a width, W;
wherein a difference between L1 and W is not more than about 150 percent of L1.

21. An electronic device, comprising:
at least one electronic component; and
a housing, comprising:
a first section to define an internal chamber; and
an ionic airflow system, comprising:
an anode;
a cathode platform having an elongated surface; and
a first ultrasonic transducer to direct ultrasonic waves into the cathode platform.

22. The electronic device of claim 21, further comprising a second ultrasonic transducer to inject ultrasonic waves into the anode.

23. The electronic device of claim 21, further comprising a power supply coupled to the anode.

24. The electronic device of claim 21, wherein the first ultrasonic transducer is positioned to deliver ultrasonic waves into the cathode platform at an incidence angle that measures between about 10 degrees and about 80 degrees.

25. The electronic device of claim 24, further comprising a mounting block to mount the first ultrasonic transducer to the cathode platform, wherein the mounting block is in the shape of a triangular prism.

\* \* \* \* \*